US006503813B1

(12) United States Patent
Koburger, III

(10) Patent No.: US 6,503,813 B1
(45) Date of Patent: Jan. 7, 2003

(54) METHOD AND STRUCTURE FOR FORMING A TRENCH IN A SEMICONDUCTOR SUBSTRATE

(75) Inventor: Charles W. Koburger, III, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/595,978

(22) Filed: Jun. 16, 2000

(51) Int. Cl.[7] ............................................... H01L 21/76
(52) U.S. Cl. ...................... 438/424; 438/296; 438/404; 438/207; 438/221; 438/243; 438/359; 438/391
(58) Field of Search ................................ 438/296, 404, 438/424, 207, 221, 243, 359, 391

(56) References Cited

U.S. PATENT DOCUMENTS

| 4,489,101 A | 12/1984 | Shibata |
| 4,746,630 A | 5/1988 | Hui et al. |
| 5,045,150 A | 9/1991 | Cleeves et al. |
| 5,360,758 A | 11/1994 | Bronner et al. |
| 5,385,852 A | 1/1995 | Oppermann et al. |
| 5,401,998 A | 3/1995 | Chiu et al. |
| 5,413,966 A | 5/1995 | Schoenborn |

(List continued on next page.)

FOREIGN PATENT DOCUMENTS

JP        7-161806    *  6/1995

OTHER PUBLICATIONS

Wolf, S. Silicon Processing for the VLSI Era, 1986, Lattice Press, vol. 1, pp. 539–542.*
Wolf, S. Silicon Processing for the VLSI Era, 1990, Lattice Press, vol. 2, pp. 45–46.*

Sealed–Interface Local Oxidation Technology, Hui et al., vol. 29, No. 4, Apr. 1982, IEEE Transactions on Electron Devices, pp. 554561.

Selective Oxidation Technologies For High Density Mos, Hui et al., vol. EDL–2, No. 10, Oct. 1981, IEEE Electron Device Letters, pp. 244–247.

*Primary Examiner*—Kamand Cuneo
*Assistant Examiner*—David A. Zarneke
(74) *Attorney, Agent, or Firm*—Schmeiser, Olsen & Watts; Anthony Canale

(57) ABSTRACT

A method and structure for forming a trench in a semiconductor substrate that includes a semiconductor material such as silicon. The method and structure may be used to form a deep trench or a shallow trench, without having a pad oxide in contact with the semiconductor substrate. The method for forming the deep trench forms a nitride layer on the semiconductor substrate, wherein the selectively etchable layer (e.g., a nitride layer) is selectively etchable with respect to the semiconductor substrate, and wherein there is no pad oxide between the selectively etchable layer and the semiconductor substrate. An erosion resistant layer (e.g., a hard mask oxide layer) is formed on the selectively etchable layer, wherein the erosion resistant layer is resistant to being etched by a reactive ion etch (RIE) process that etches the semiconductor substrate. Then the deep trench is formed by RIE through the erosion resistant layer, through the selectively etchable layer, and into the semiconductor substrate. The method for forming the shallow trench forms a nitride layer on the semiconductor substrate, wherein the selectively etchable layer (e.g., a nitride layer) is selectively etchable with respect to the semiconductor substrate, and wherein there is no pad oxide between the selectively etchable layer and the semiconductor substrate. Then the deep trench is formed by RIE through the selectively etchable layer and into the semiconductor substrate, followed by depositing and planarizing an insulative material in the shallow trench.

25 Claims, 5 Drawing Sheets

U.S. PATENT DOCUMENTS

| | | |
|---|---|---|
| 5,470,783 A | 11/1995 | Chiu et al. |
| 5,665,622 A | 9/1997 | Muller et al. |
| 5,783,496 A | 7/1998 | Flanner et al. |
| 5,801,083 A | 9/1998 | Yu et al. |
| 5,904,566 A | 5/1999 | Tao et al. |
| 5,981,341 A | 11/1999 | Kim et al. |
| 6,008,095 A * | 12/1999 | Gardner et al. |
| 6,025,245 A * | 2/2000 | Wei |
| 6,033,968 A * | 3/2000 | Sung |
| 6,228,741 B1 * | 5/2001 | Walsh et al. |
| 6,248,644 B1 * | 6/2001 | Yang et al. |

* cited by examiner

METHOD AND STRUCTURE FOR FORMING A TRENCH IN A SEMICONDUCTOR SUBSTRATE

BACKGROUND OF THE INVENTION

1. Technical Field

The present invention relates to a method and structure for forming a trench in a semiconductor substrate.

2. Related Art

Trenches are typically formed in a semiconductor substrate as part of a process for fabricating semiconductor device such as, inter alia, devices using dynamic random access memory (DRAM). Fabrication of such trenches have utilized a nitride-oxide pad on the semiconductor substrate. A nitride-oxide pad comprises a pad nitride layer (e.g., silicon nitride) on a pad oxide layer (e.g., an oxide such as silicon dioxide). The pad oxide layer directly contacts the semiconductor substrate during the process of forming the trench. The pad nitride layer does not directly contact the semiconductor substrate during the process of forming the trench. The pad nitride layer serves as a polish stop layer for subsequent processes. The pad oxide layer serves as a stress buffer between the nitride layer and the semiconductor substrate, for preventing stresses that might otherwise occur, in an absence of the pad oxide, during subsequent processing in the fabrication of the semiconductor devices.

The aforementioned use of a pad oxide has adverse consequences when used to form a deep trench or a shallow trench. If a pad oxide is used on the semiconductor substrate for forming a deep trench that passes through the nitride-oxide pad, then the deep trench exposes the pad oxide layer along the trench sidewalls. Oxides subsequently grown on the trench sidewalls, as part of fabricating the overall semiconductor device, need to be removed such as by use of a wet etch process. Unfortunately, the wet etchant attacks the pad oxide in addition to the grown oxides on the trench sidewalls, resulting in undercutting into the pad oxide layer under the nitride layer. Each application of chemical etchant to the trench during post-deep trench formation processing increases the undercut in the pad oxide under the nitride layer. Furthermore, the undercut exposes a horizontal silicon surface which is then subject to undesired silicon oxide formation because of the exposure. The undesired silicon oxide thus formed is subject to subsequent attack by the aforementioned chemical etchant. Eventual removal of the pad oxide results in an uneven, rough corner of the semiconductor substrate. The uneven, rough corner has a stepped ledge structure that interferes with an ability to control the geometry of the final structure of the semiconductor device.

If a pad oxide is used on the semiconductor substrate, then forming a shallow trench such as for shallow trench isolation (STI) applications may cause undercutting if post-shallow trench formation processing comprises wet etch oxide removal steps. The undercutting would be caused by the same mechanism that governs undercutting in deep trenches as described supra. Even if the post-shallow trench formation processing does not includes wet etch oxide removal steps, the use of a pad oxide results in unnecessary processing that adds to the overall fabrication costs.

A method is needed to form a trench in a semiconductor substrate without having a pad oxide in contact with the semiconductor substrate.

SUMMARY OF THE INVENTION

The present invention provides a method for forming a deep trench in a semiconductor substrate, comprising:

providing the semiconductor substrate;

forming a selectively etchable layer on the semiconductor substrate, wherein the selectively etchable layer is selectively etchable with respect to the semiconductor substrate, and wherein there is an absence of a pad oxide between the selectively etchable layer and the semiconductor substrate;

forming an erosion resistant layer on the selectively etchable layer, wherein the erosion resistant layer is erosion resistant with respect to the semiconductor substrate; and forming the deep trench through the erosion resistant layer, through the selectively etchable layer, and into the semiconductor substrate.

The present invention provides a method for forming a shallow trench in a semiconductor substrate, comprising:

providing the semiconductor substrate;

forming a selectively etchable layer on the semiconductor substrate, wherein the selectively etchable layer is selectively etchable with respect to the semiconductor substrate, and wherein there is an absence of a pad oxide between the selectively etchable layer and the semiconductor substrate;

forming the shallow trench through the selectively etchable layer and into the semiconductor substrate;

depositing an insulative material in the shallow trench, wherein the insulative material overfills the shallow trench; and planarizing the insulative material with respect to the shallow trench.

The present invention provides a method for forming a trench structure in a semiconductor substrate, comprising:

forming a deep trench in the semiconductor substrate, comprising:
  providing the semiconductor substrate;
  forming a selectively etchable layer on the semiconductor substrate, wherein the selectively etchable layer is selectively etchable with respect to the semiconductor substrate, and wherein there is an absence of a pad oxide between the selectively etchable layer and the semiconductor substrate;
  forming an erosion resistant layer on the selectively etchable layer, wherein the erosion resistant layer is erosion resistant with respect to the semiconductor substrate;
  forming the deep trench through the erosion resistant layer, through the selectively etchable layer, and into the semiconductor substrate; and
  removing the erosion resistant layer without formation of undercutting under the selectively etchable layer.

forming a layer of insulation on a sidewall of the deep trench;

partially filling the deep trench with a conductive material;

forming a shallow trench through the selectively etchable layer and into the semiconductor substrate:

depositing an insulative material in the shallow trench, wherein the insulative material fills the shallow trench;

planarizing the insulative material with respect to the shallow trench; and removing the selectively etchable layer.

The present invention provides a deep trench structure in a semiconductor substrate, comprising:

the semiconductor substrate;

a selectively etchable layer on the semiconductor substrate, wherein the selectively etchable layer is selectively etchable with respect to the semiconductor substrate, and wherein there is an absence of a pad oxide between the selectively etchable layer and the semiconductor substrate; and an erosion resistant layer on the selectively etchable layer, wherein the erosion resistant layer is erosion resistant with respect to the semiconductor substrate.

The present invention provides a shallow trench structure in a semiconductor substrate, comprising:

the semiconductor substrate; and a selectively etchable layer on the semiconductor substrate, wherein the selectively etchable layer is selectively etchable with respect to the semiconductor substrate, and wherein there is an absence of a pad oxide between the selectively etchable layer and the semiconductor substrate.

The present invention provides a method and structure for forming a trench in a semiconductor substrate without having a pad oxide in contact with the semiconductor substrate. Since a pad oxide is absent, the present invention does not result in undercutting under the selectively etchable layer, and the present invention does not unnecessarily add to fabrication costs.

DETAILED DESCRIPTION OF THE INVENTION

Figure 1:
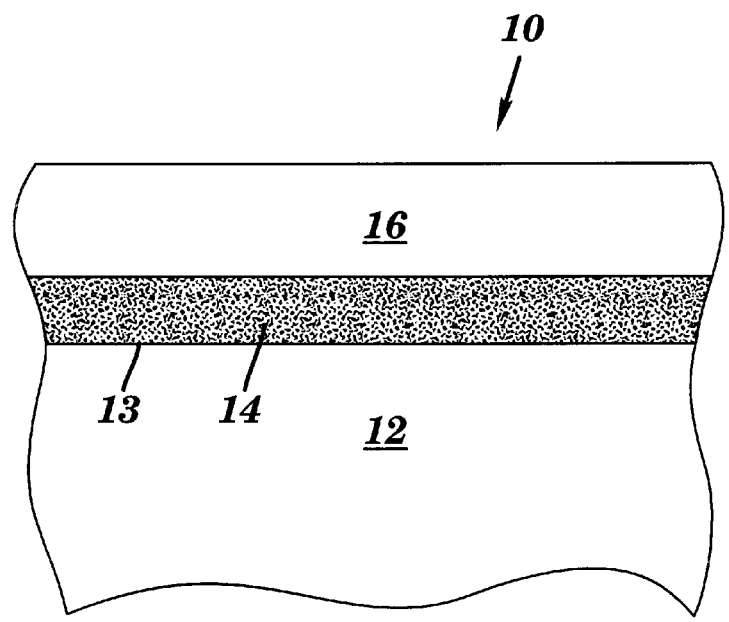
FIG. 1 depicts a front cross-sectional view of an electronic structure having a selectively etchable layer on a semiconductor substrate and an erosion resistant layer on the selectively etchable layer, in accordance with embodiments of the present invention for forming a deep trench in the semiconductor substrate.

FIG. 1 illustrates a front cross-sectional view of an electronic structure 10 having a selectively etchable layer 14 on a semiconductor substrate 12, and an erosion resistant layer 16 on the selectively etchable layer 14, in accordance with embodiments of the present invention for forming a deep trench in the semiconductor substrate 12. The deep trench formed by the method of the present invention has a depth of at least about 4000 Å. The semiconductor substrate 12 comprises a semiconductor material such as silicon. The selectively etchable layer 14 comprises a selectively etchable material, such as a nitride (e.g., silicon nitride $Si_3N_4$), with respect the semiconductor material. A layer (or material) X is said to be selectively etchable with respect to a layer (or material) Y if, upon subjecting both X and Y to an etchant, Y is not materially etched during a period of time in which X is etched. The selectively etchable layer 14 serves as a polish stop for subsequent mechanical removal of the erosion resistant layer 16, as well as a protective barrier that prevents portions of the semiconductor substrate 12 from being oxidized during subsequent processing steps. A thickness of the selectively etchable layer 14 is between about 1000 Å and about 2500 Å. If the selectively etchable layer 14 includes a nitride and the semiconductor substrate 12 includes silicon, then the selectively etchable layer 14 may be formed by, inter alia, thermally nitridizing a surface 13 of the semiconductor substrate 12 to form a nitridized surface of the semiconductor substrate 12, followed by depositing a pad nitride on the nitridized surface in a conventional manner, wherein a thickness of the pad nitride exceeds a thickness of the nitridized surface.

The erosion resistant layer 16 is erosion resistant with respect to the semiconductor substrate 12. Said erosion resistance of the erosion resistant layer 16 requires: that the semiconductor substrate 12 be selectively etchable with respect to the erosion resistant layer 16; or that the erosion resistant layer 16 be sufficiently thick, such that after completion of a process that etches both the semiconductor substrate 12 and the erosion resistant layer 16, a finite thickness of the erosion resistant layer 16 remains. The erosion resistant layer 16 comprises an erosion resistant material such as a hard mask oxide; e.g., silicon dioxide ($SiO_2$), boro silicate glass (BSG), phospho silicate glass (PSG), and boro phospho silicate glass (BPSG). A thickness of the erosion resistant layer 16 is at least about 7000 Å.

Figure 2:
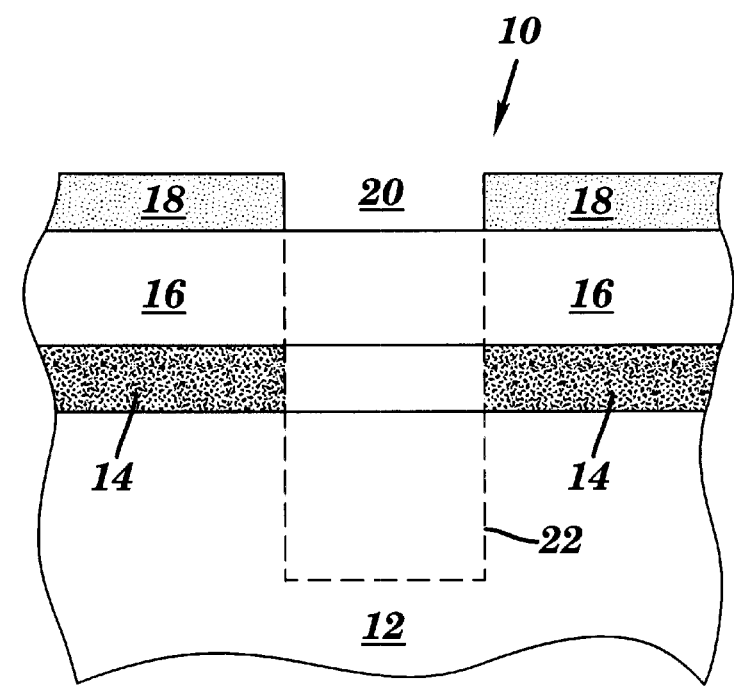
FIG. 2 depicts FIG. 1 with a photoresist layer on the erosion resistant layer.

FIG. 2 illustrates FIG. 1 with a photoresist layer 18 on the erosion resistant layer 16. The photoresist layer 18 has been patterned and exposed with radiation such as ultraviolet radiation. Followed exposure to the radiation, a portion of the photoresist layer 18 has been etched away to form an opening 20 in the photoresist layer 18 such that a deep trench is to be subsequently formed in the electronic structure 10 under the opening 20 within the line pattern 22.

Figure 3:
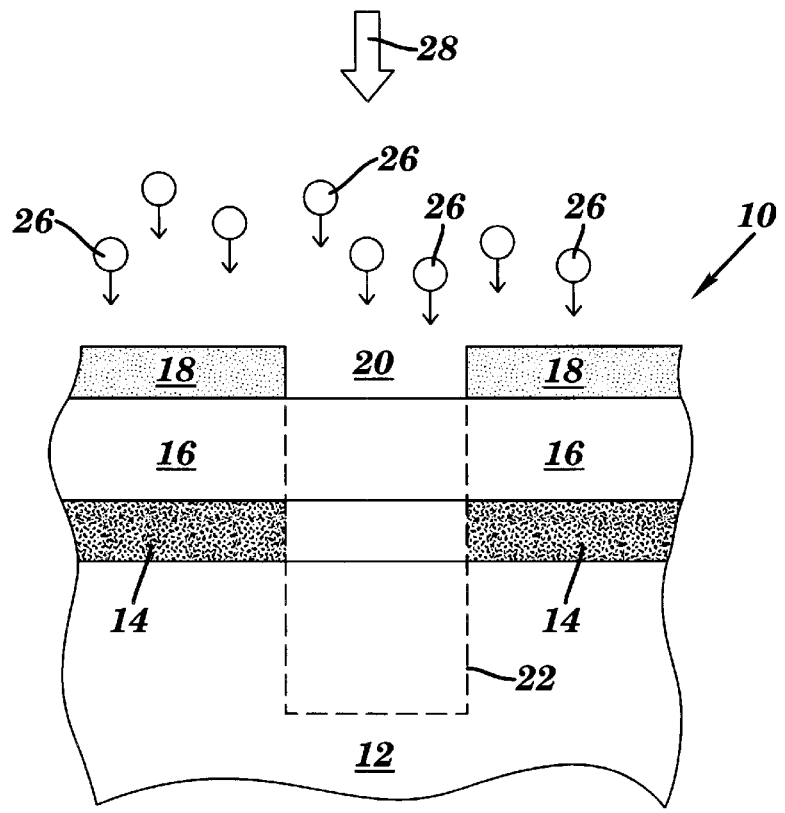
FIG. 3 depicts FIG. 2 with the electronic structure being etched by a reactive ion etch process to form the deep trench in the electronic structure.

FIG. 3 illustrates FIG. 2 with the electronic structure 10 being dry etched, such as by a reactive ion etch (RIE) process using anisotropically distributed ions 26. The ions 26 are directed toward the electronic structure 10 in a direction 28 to form the deep trench in the electronic structure 10. As shown by the dashed line pattern 22, formation of the deep trench includes etching under the opening 20 of: the erosion resistant layer 16, the selectively etchable layer 14, and the semiconductor substrate 12. Thus the deep trench is formed through the erosion resistant layer 16 and the selectively etchable layer 14 (under the opening 20), and into the semiconductor substrate 12 in the direction 28. Any applicable RIE processes known to one or ordinary skill in the art may be used, and one or more distinct RIE processes may be required for effectively etching the relevant portions of the erosion resistant layer 16, the selectively etchable layer 14, and the semiconductor substrate 12.

For example, a first RIE process may be used to etch the erosion resistant layer 16 and the selectively etchable layer 14, followed by a second RIE process to etch the semiconductor substrate 12. The first RIE process may utilize, inter alia, a medium-plasma-density RIE tool, such as a mixture of $CHF_3$, $CF_4$, and Ar in an Applied Materials Corporation MXP etch tool. The second RIE process may utilize, inter alia, a medium-plasma-density RIE tool, such as mixture of HBr, $NF_3$, and $O_2$ in a Tokyo Electron Inc. 85DD etch tool. The erosion resistence of the erosion resistant layer 16 is in relation to the second RIE process.

Figure 4:
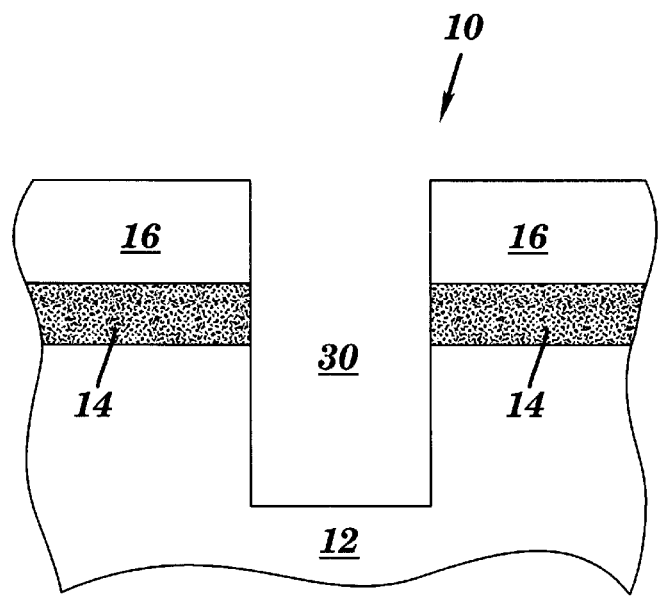
FIG. 4 depicts FIG. 3 after the deep trench has been formed.

FIG. 4 illustrates FIG. 3 after the deep trench 30 has been formed by the etching described supra in conjunction with FIG. 3. After the deep trench 30, or a portion thereof, has been formed, the remaining portion of the photoresist layer 18 (see FIG. 3) is removed by any method known to one of ordinary skill in the art. If the deep trench 30 is formed by the first RIE process and the second RTE describe supra in conjunction with FIG. 3, then the remaining portion of the photoresist layer 18 is removed after the first RIE process and before the second RIE process.

Figure 5:
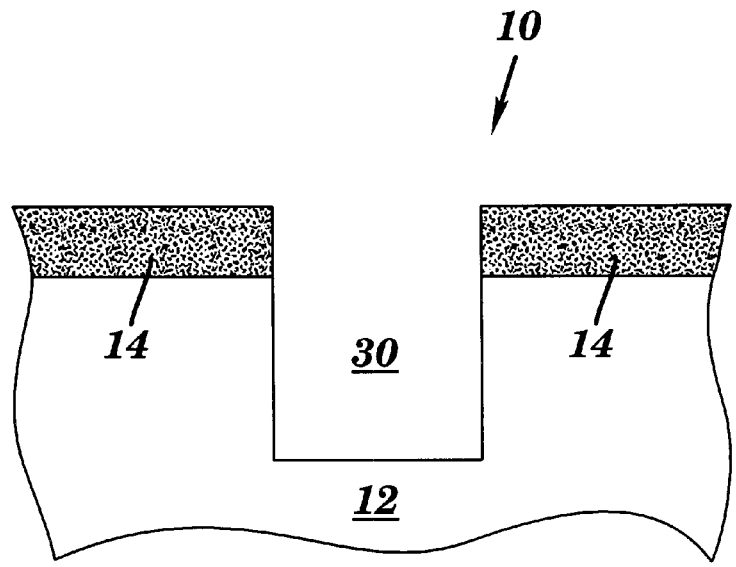
FIG. 5 depicts FIG. 4 after the erosion resistant layer has been removed.

FIG. 5 illustrates FIG. 4 after the erosion resistant layer 16 has been removed by any method known to one of ordinary skill in the art such as by, inter alia, a wet etch process (e.g., a wet etch process that uses buffered hydrogen fluoride HF). Said removal of the erosion resistant layer 16 will be without formation of undercutting under the selectively etchable layer 14 because of an absence of an interfacing pad oxide between the the selectively etchable layer 14 and the semiconductor substrate 12.

Figure 6:
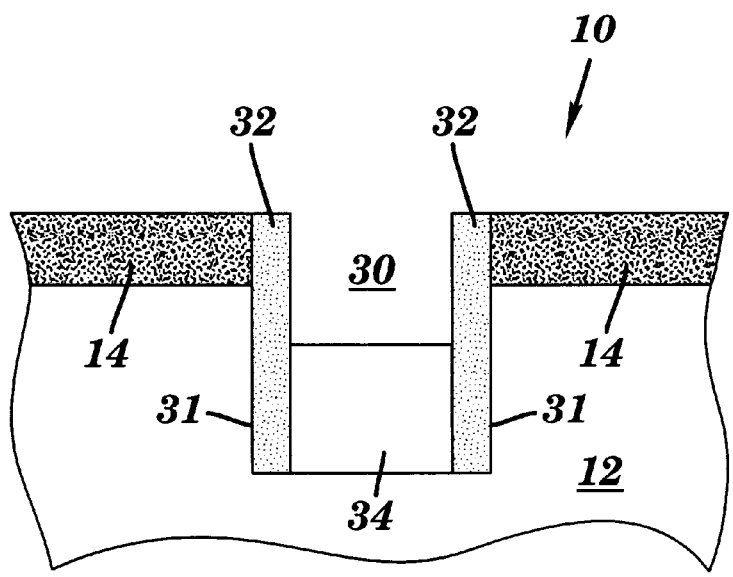
FIG. 6 depicts FIG. 5 after a layer of insulation has been formed on a sidewall of the deep trench and the deep trench has been partially filled with a conductive material.

FIG. 6 illustrates FIG. 5 after a layer 32 of insulating material, such as silicon dioxide or silicon nitride, has been formed on a sidewall 31 of the deep trench 30 by any method known to one of ordinary skill on the art. The deep trench 30 has been partially filled with a conductive material 34 such as polysilicon. The configuration of FIG. 6 represents further processing beyond formation of the deep trench 30 in an overall fabrication of a semiconductor device.

Figure 7:
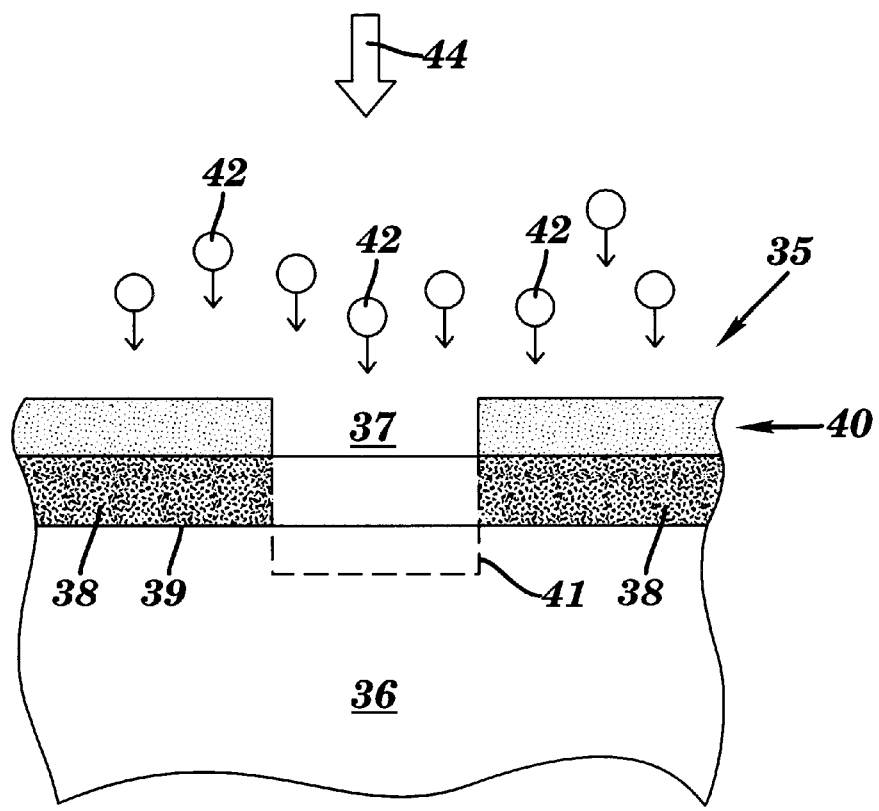
FIG. 7 depicts a front cross-sectional view of: an electronic structure having a selectively etchable layer on a semiconductor substrate, a photoresist layer on the selectively etchable layer, and ions of a reactive ion etch for forming a shallow trench in the semiconductor substrate, in accordance with embodiments of the present invention.

FIG. 7 illustrates a front cross-sectional view of an electronic structure 35 having a selectively etchable layer 38 on a semiconductor substrate 36, and a photoresist layer 40 on the selectively etchable layer 38, in accordance with embodiments of the present invention for forming a shallow trench in the semiconductor substrate 36. The shallow trench formed by the method of the present invention has a depth no greater than about 5000 Å. As stated supra, the method of the present invention for forming a deep trench applies to trench depths of at least about 4000 Å. Accordingly, either method of the present invention (i.e., for forming a deep trench or for forming a shallow trench) is applicable to trenches having a depth between about 4000 Å and about 5000 Å.

In FIG. 7, the semiconductor substrate 36 comprises a semiconductor material such as silicon. The selectively etchable layer 38 comprises a selectively etchable material, such as a nitride (e.g., silicon nitride $Si_3N_4$), with respect to the semiconductor material. A thickness of the selectively etchable layer 38 is between about 500 Å and about 1500 Å. If the selectively etchable layer 38 includes a nitride and the semiconductor substrate 36 includes silicon, then the selectively etchable layer 38 may be formed by, inter alia, thermally nitridizing a surface 39 of the semiconductor substrate 36 to form a nitridized surface of the semiconductor substrate 36, followed by depositing a pad nitride on the nitridized surface in a conventional manner, wherein a thickness of the pad nitride exceeds a thickness of the nitridized surface. The photoresist layer 40 has been patterned and exposed with radiation such as ultraviolet radiation. Followed exposure to the radiation, a portion of the photoresist layer 40 has been etched away to form an opening 37 in the photoresist layer 40 such that a shallow trench is to be subsequently formed in the electronic structure 35 under the opening 37 within the line pattern 41. As shown by the line pattern 41, formation of the shallow trench includes etching in the direction 44, and under the opening 37, through the selectively etchable layer 38 and into the semiconductor substrate 36.

FIG. 7 also shows the electronic structure 35 being dry etched, such as by a reactive ion etch process using anisotropically distributed ions 42. The ions 42 are directed toward the electronic structure 35 in the direction 44 to form the shallow trench in the electronic structure 35. Any applicable RIE processes known to one or ordinary skill in the art may be used, and one or more distinct RIE processes may be required for effectively etching both the selectively etchable layer 38, and the semiconductor substrate 36. For example, an initial RIE process using a mixture of $CHF_3$ and $O_2$ may be used to etch the selectively etchable layer 38, followed by a second RIE process using a mixture of $NF_3$ and Ar to etch the semiconductor substrate 36.

Figure 8:
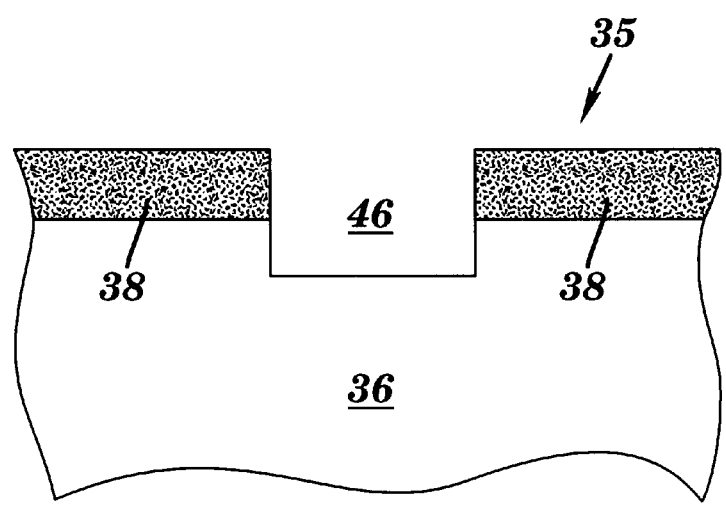
FIG. 8 depicts FIG. 7 after the shallow trench has been formed.

FIG. 8 illustrates FIG. 7 after the shallow trench 46 has been formed by the etching described supra in conjunction with FIG. 7. After the shallow trench 46 has been formed, the remaining portion of the photoresist layer 40 (see FIG. 7) is removed.

Figure 9:
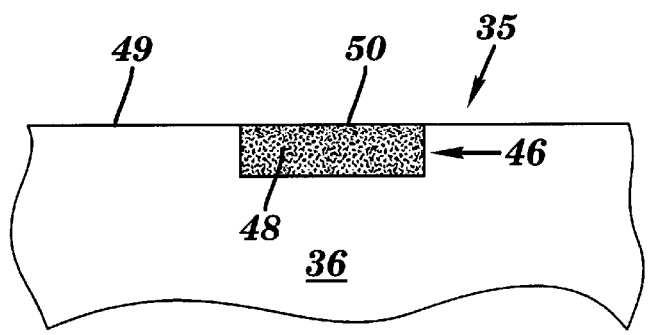
FIG. 9 depicts FIG. 8 after the selectively etchable layer has been removed and the shallow trench has been filled with an insulative material.

FIG. 9 illustrates FIG. 8 after the selectively etchable layer 38 has been removed and the shallow trench 46 has been filled with an insulative material 48 such as silicon dioxide, by any method known to one of ordinary skill in the art. For example, the shallow trench 46 in FIG. 8 may be filled with the insulative material 48 such that the insulative material 48 overfills the shallow trench 46 and accordingly covers all or a portion of the selectively etchable layer 38. Next, the insulative material 48 may be planarized, such as by chemical mechanical polishing (CMP). The planarization removes all the insulative material 48 that covers the selectively etchable layer 38 and also may remove a top portion of the selectively etchable layer 38, leaving a remaining portion of the selectively etchable layer 38 exposed. The planarization also removes enough insulative material 48 within the shallow trench 46 to leave an exposed top surface of the insulative material 48 within the shallow trench 46 that is about coplanar with a top surface of the remaining portion of the selectively etchable layer 38. Next, the selectively etchable layer 38 may be removed by any method known to one of ordinary skill in the art, such as by etching in hot (e.g., between about 160° C. and about 170° C.) phosphoric acid. In relation to said removal of the selectively etchable layer 38, the selectively etchable layer 38 is selectively etchable with respect to the semiconductor substrate 36 as stated supra. Said removal of the selectively etchable layer 38 leaves intact most or all of the insulative material 48 within the shallow trench 46. Subsequent processing relating to fabricating a finished product from the electronic structure 35 removes some insulative material 48, resulting in a top surface 50 of the resultant insulative material 48 that is at about a same level as a top surface 49 of the semiconductor substrate 36. Such subsequent process may include, inter alia, surface exposure in a buffered HF dip and heating that causes the insulative material 48 to shrink such as by causing trapped or dissolved gas (e.g., air) to be expelled from the insulative material 48.

Figure 10:
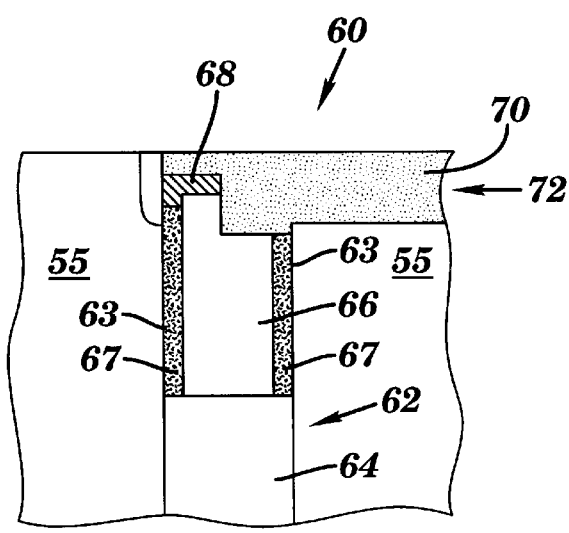
FIG. 10 depicts an eletronic structure comprising portions which are analogous to the electronic structures of FIGS. 6 and 9, in accordance with embodiments of the present invention.

FIG. 10 illustrates an electronic structure 60 that comprises structure that is analogous to portions of the electronic structures 10 and 35 of FIGS. 6 and 9, respectively, in accordance with embodiments of the present invention. The electronic structure 60 includes a semiconductor substrate 55, a deep trench 62 in the semiconductor substrate 55, and a shallow trench 72 in the semiconductor substrate 55. The semiconductor substrate 55 comprises a semiconductor material such as silicon. The deep trench 62 includes an upper portion having a layer 67 of insulating material, such as silicon dioxide or silicon nitride, on a sidewall 63 of the deep trench 62, and the upper portion is filled with a first conductive material 66 such as a polysilicon. The deep trench 62 also includes a lower portion filled with a second conductive material 64 such as a doped polysilicon. The shallow trench 72 is filled with an insulative material 70 such as silicon dioxide. A conductive strap 68 is in conductive contact with the first conductive material 66. With the deep trench 62 fabricated according to the method of the present invention described supra in conjunction with FIG. 1–6, and the shallow trench 72 fabricated according to the method of the present invention described supra in conjunction with FIG. 7–9, the remaining portions of FIG. 10 (i.e., the second conductive material 64, the first conductive material 66, and the conductive strap 68) may be formed by any method known to one skilled in the art, such as by methods described in U.S. Pat. No. 5,360,758 (Bronner et al., 1994) which is incorporated herein by reference. Note that FIG. 10 herein is analogous to FIG. 5 in U.S. Pat. No. 5,360,228.

Figure 11:
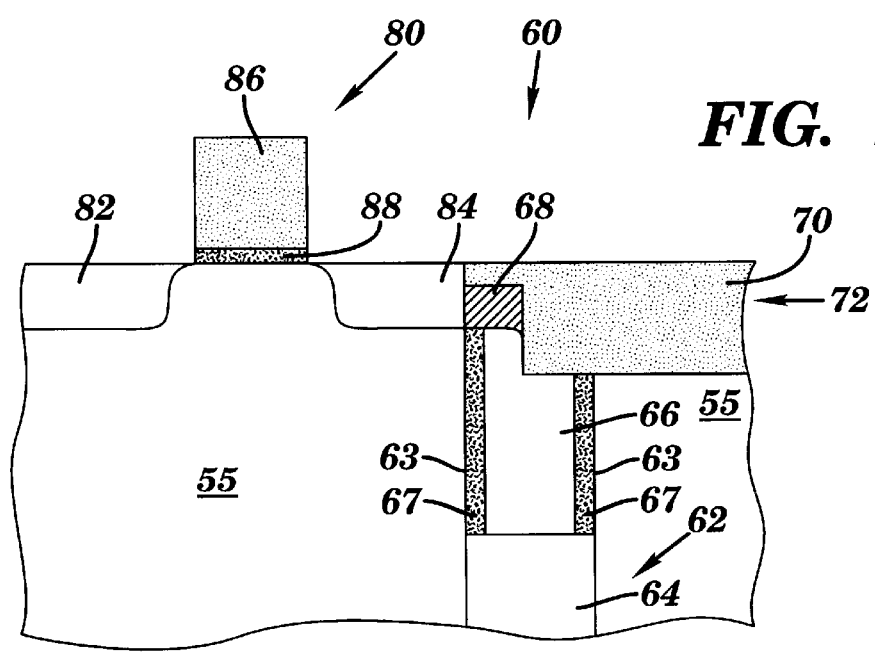
FIG. 11 depicts the electronic structure of FIG. 10 after forming a field effect transistor (FET) such that the FET is integral with the semiconductor substrate.

FIG. 11 illustrates the electronic structure of FIG. 10 after forming a field effect transistor (FET) 80 such that the FET 80 is integral with the semiconductor substrate 55. The FET 80 includes a source 82, a drain 84, a gate 86, and a gate insulator 88. The drain 84 of the FET 80 is in conductive contact with the conductive strap 68. Note that the locations of the source 82 and the drain 84 may be interchanged in which case the source 82 would be in conductive contact with the conductive strap 68. The FET 80 may be formed by any method known to one skilled in the art, such as by methods described in U.S. Pat. No. 5,360,228. Note that FIG. 10 herein is analogous to FIG. 1 in U.S. Pat. No. 5,360,228.

An aspect of the present invention is an absence of a pad oxide between a selectively etchable layer and a semiconductor substrate for forming a deep trench or a shallow trench in the semiconductor substrate. The inventor of the present invention designed and participated in experiments that tested whether the pad oxide is necessary, and found that the pad oxide was not necessary which is in contrast with prevailing thinking in the related art that the pad oxide is necessary. The experiments performed and the results thereof are as follows.

Two lots of dynamic random access memory (DRAM) integrated circuits (IC's) were fabricated, each in a different fabrication facility. Each lot used wafers having structures and processes similar to structures and processes described in U.S. Pat. No. 5,360,758. The first lot included 20 wafers with 3 wafers having a pad nitride directly on a silicon substrate and no pad oxide, and 17 wafers having pad oxide thicknesses between about 45 Å and about 100 Å directly on a silicon substrate and a pad nitride of thickness about 2000 Å on the pad oxide. The second lot included 16 wafers with 6 wafers having a pad nitride directly on a silicon substrate and no pad oxide, and 10 wafers having a pad oxide of thickness about 68 Å directly on a silicon substrate and a pad nitride of thickness about 220 Å on the pad oxide. All wafers having pad oxide were processed in accordance with state-of-the-art procedures that including pad oxide formation followed by chemical vapor deposition (CVD) of pad nitride on the pad oxide. All wafers not having pad oxide were processed in such a manner that pad nitride was formed, via CVD, directly on the silicon substrate as disclosed supra for the present invention. The CVD silicon nitride was deposited on all wafers of each lot concurrently. Both deep trenches and shallow trenches were formed in each batch. In the first batch, deep trenches were formed such that each deep trench had a depth of about 70,000 Å, and shallow trenches were formed such that each shallow trench had a depth of about 2,800 Å. In the second batch, deep trenches were formed such that each deep trench had a depth of about 70,000 Å, and shallow trenches were formed such that each shallow trench had a depth of about 2,800 Å. Following completion of deep trench and shallow trench formation, as described herein, the pad nitride was selectively removed (with respect to the silicon substrate) using hot (i.e., about 160° C. in the first batch and about 165° C. in the second batch) phosphoric acid. The pad nitride removal served as a preparation step for subsequent fabrication of field effect transistors on the silicon surface exposed by the removal of the pad nitride. Subsequent to removal of the pad nitride, all wafers within the first lot were processed identically employing industry-standard processes. Similarly, subsequent to removal of the pad nitride, all wafers within the second lot were processed identically employing industry-standard processes. The industry-standard processes (including, inter alia, mask and ion implantation to form P-wells and N-wells, growing or depositing layers of oxide, depositing layers of polysilicon, etc.) differed for the first lot and the second lot. Within each lot, the yields were similar; i.e., within acceptable statistical deviation for the wafers having and not having pad oxide. Yield is defined as the number of acceptable fabrications/total number of fabrications, wherein a fabrication pertains to a final IC produced or an intermediate stage in the production of an IC.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

I claim:

1. A method for forming a deep trench in a semiconductor substrate, comprising:

providing the semiconductor substrate;

forming a selectively etchable layer on the semiconductor substrate, wherein the selectively etchable layer is selectively etchable with respect to the semiconductor substrate, and wherein there is an absence of a pad oxide between the selectively etchable layer and the semiconductor substrate;

forming an erosion resistant layer on the selectively etchable layer, wherein the erosion resistant layer is erosion resistant with respect to the semiconductor substrate; and forming the deep trench through the erosion resistant layer, through the selectively etchable layer, and into the semiconductor substrate.

2. The method of claim 1, wherein the step of forming the deep trench comprises performing a reactive ion etching (RIE) through the erosion resistant layer, through the selectively etchable layer, and into the semiconductor substrate.

3. A method for forming a deep trench in a semiconductor substrate, comprising:

providing the semiconductor substrate;

forming a selectively etchable layer on the semiconductor substrate, wherein the selectively etchable layer is selectively etchable with respect to the semiconductor substrate, and wherein there is an absence of a pad oxide between the selectively etchable layer and the semiconductor substrate;

forming an erosion resistant layer on the selectively etchable layer, wherein the erosion resistant layer is erosion resistant with respect to the semiconductor substrate; and forming the deep trench through the erosion resistant layer, through the selectively etchable layer, and into the semiconductor substrate, wherein forming the deep trench comprises performing a reactive ion etching (RIE) through the erosion resistant layer, through the selectively etchable layer, and into the semiconductor substrate, wherein the RIE comprises a first RIE through the erosion resistant layer and through the selectively etchable layer, and a second RIE into the semiconductor substrate, wherein an erosion resistance of the erosion resistant layer is in relation to the second RIE.

4. The method of claim 1, further comprising removing the erosion resistant layer without formation of undercutting under the selectively etchable layer.

5. A method for forming a deep trench in a semiconductor substrate, comprising:

providing the semiconductor substrate;

forming a selectively etchable layer on the semiconductor substrate, wherein the selectively etchable layer is selectively etchable with respect to the semiconductor substrate, wherein there is an absence of a pad oxide between the selectively etchable layer and the semiconductor substrate, and wherein forming the selectively etchable layer comprises nitridizing a surface of the semiconductor substrate to form a nitridized surface of the semiconductor substrate, followed by depositing a pad nitride on the nitridized surface wherein a thickness of the pad nitride exceeds a thickness of the nitridized surface;

forming an erosion resistant layer on the selectively etchable layer, wherein the erosion resistant layer is erosion resistant with respect to the semiconductor substrate; and forming the deep trench through the erosion resistant layer, through the selectively etchable layer, and into the semiconductor substrate.

6. The method of claim 1, wherein a thickness of the selectively etchable layer is between about 1000 Å and about 2500 Å.

7. The method of claim 1, wherein a thickness of the erosion resistant layer is at least about 7000 Å.

8. The method of claim 1, wherein the selectively etchable layer includes a nitride.

9. The method of claim 8, wherein the nitride includes silicon nitride.

10. The method of claim 1, wherein the erosion resistant layer includes an oxide.

11. The method of claim 10, wherein the oxide is selected from the group consisting of silicon dioxide ($SiO_2$), boro silicate glass (BSG), phospho silicate glass (PSG), and boro phospho silicate glass (BPSG).

12. The method of claim 1, wherein the semiconductor substrate includes silicon.

13. A method for forming a shallow trench in a semiconductor substrate, comprising:

providing the semiconductor substrate;

forming a selectively etchable layer on the semiconductor substrate, wherein the selectively etchable layer is selectively etchable with respect to the semiconductor substrate, wherein there is an absence of a pad oxide between the selectively etchable layer and the semiconductor substrate, and wherein forming the selectively etchable layer comprises nitridizing a surface of the semiconductor substrate to form a nitridized surface of the semiconductor substrate, followed by depositing a pad nitride on the nitridized surface wherein a thickness of the pad nitride exceeds a thickness of the nitridized surface;

forming the shallow trench through the selectively etchable layer and into the semiconductor substrate;

depositing an insulative material in the shallow trench, wherein the insulative material overfills the shallow trench; and planarizing the insulative material with respect to the shallow trench.

14. The method of claim 13, wherein a thickness of the selectively etchable layer is between about 500 Å and about 1500 Å.

15. The method of claim 13, wherein the selectively etchable layer includes a nitride.

16. The method of claim 15, wherein the nitride includes silicon nitride.

17. The method of claim 13, wherein the insulative material includes silicon dioxide.

18. The method of claim 13, wherein the semiconductor substrate includes silicon.

19. A method for forming a trench structure in a semiconductor substrate, comprising:

forming a deep trench in the semiconductor substrate, comprising:
providing the semiconductor substrate;
forming a selectively etchable layer on the semiconductor substrate, wherein the selectively etchable layer is selectively etchable with respect to the semiconductor substrate, and wherein there is an absence of a pad oxide between the selectively etchable layer and the semiconductor substrate;
forming an erosion resistant layer on the selectively etchable layer, wherein the erosion resistant layer is erosion resistant with respect to the semiconductor substrate;
forming the deep trench through the erosion resistant layer, through the selectively etchable layer, and into the semiconductor substrate; and
removing the erosion resistant layer without formation of undercutting under the selectively etchable layer;

forming a layer of insulation on a sidewall of the deep trench;

partially filling the deep trench with a conductive material;

forming a shallow trench through the selectively etchable layer and into the semiconductor substrate:

depositing an insulative material in the shallow trench, wherein the insulative material fills the shallow trench;

planarizing the insulative material with respect to the shallow trench; and removing the selectively etchable layer.

20. The method of claim 19, wherein the conductive material includes a polysilicon material.

21. The method of claim 19, further comprising:

forming a conductive strap in conductive contact with the conductive material; and forming a field effect transistor (FET), wherein the FET is integral with the semiconductor substrate, and wherein a drain or source of the FET is in conductive contact with the conductive strap.

22. A method for forming a deep trench in a semiconductor substrate, comprising:

providing the semiconductor substrate;

forming a selectively etchable layer on the semiconductor substrate, wherein the selectively etchable layer is selectively etchable with respect to the semiconductor substrate, and wherein there is an absence of a pad oxide between the selectively etchable layer and the semiconductor substrate;

forming an erosion resistant layer on the selectively etchable layer, wherein the erosion resistant layer is erosion resistant with respect to the semiconductor substrate; and forming the deep trench having a depth of at least 4000 Å through the erosion resistant layer, through the selectively etchable layer, and into the semiconductor substrate.

23. A method for forming a deep trench in a semiconductor substrate, comprising:

providing the semiconductor substrate;

forming a selectively etchable layer on the semiconductor substrate, wherein the selectively etchable layer is selectively etchable with respect to the semiconductor substrate, and wherein there is an absence of a pad oxide between the selectively etchable layer and the semiconductor substrate;

forming an erosion resistant layer on the selectively etchable layer, wherein the erosion resistant layer is erosion resistant with respect to the semiconductor substrate due to the substrate being selectively etchable with respect to the erosion resistant layer; and forming the deep trench through the erosion resistant layer, through the selectively etchable layer, and into the semiconductor substrate.

24. A method for forming a deep trench in a semiconductor substrate, comprising:

providing the semiconductor substrate;

forming a selectively etchable layer on the semiconductor substrate, wherein the selectively etchable layer is selectively etchable with respect to the semiconductor substrate, and wherein there is an absence of a pad oxide between the selectively etchable layer and the semiconductor substrate;

forming an erosion resistant layer on the selectively etchable layer, wherein the erosion resistant layer is erosion resistant with respect to the semiconductor substrate; and forming the deep trench through the erosion resistant layer, through the selectively etchable layer, and into the semiconductor substrate, wherein forming the deep trench comprises performing a reactive ion etching (RIE) through the erosion resistant layer, through the selectively etchable layer, and into the semiconductor substrate, and wherein performing the RIE includes using anisotropically distributed ions.

25. A method for forming a deep trench in a semiconductor substrate, comprising:

providing the semiconductor substrate;

forming a selectively etchable layer on the semiconductor substrate, wherein the selectively etchable layer is selectively etchable with respect to the semiconductor substrate, and wherein there is an absence of a pad oxide between the selectively etchable layer and the semiconductor substrate;

forming an erosion resistant layer on the selectively etchable layer, wherein the erosion resistant layer is erosion resistant with respect to the semiconductor substrate;

forming the deep trench through the erosion resistant layer, through the selectively etchable layer, and into the semiconductor substrate;

removing the erosion resistant layer without formation of undercutting under the selectively etchable layer;

forming a layer of insulation on a sidewall of the deep trench; and partially filling the deep trench with a conductive material such that the conductive material is in contact with the layer of insulation.

* * * * *